(12) United States Patent
Ramaswamy et al.

(10) Patent No.: US 8,809,157 B2
(45) Date of Patent: *Aug. 19, 2014

(54) METHODS OF FORMING A PROGRAMMABLE REGION THAT COMPRISES A MULTIVALENT METAL OXIDE PORTION AND AN OXYGEN CONTAINING DIELECTRIC PORTION

(71) Applicant: Micron Technology, Inc., Boise, ID (US)

(72) Inventors: D. V. Nirmal Ramaswamy, Boise, ID (US); Beth R. Cook, Meridian, ID (US); Lei Bi, Boise, ID (US); Wayne Huang, Boise, ID (US); Ian C. Laboriante, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/105,623

(22) Filed: Dec. 13, 2013

(65) Prior Publication Data

US 2014/0106534 A1 Apr. 17, 2014

Related U.S. Application Data

(63) Continuation of application No. 13/654,258, filed on Oct. 17, 2012, now Pat. No. 8,633,084.

(51) Int. Cl.
*H01L 21/20* (2006.01)

(52) U.S. Cl.
USPC ............................ 438/381; 257/E21.396

(58) Field of Classification Search
USPC ................ 438/3, 238, 239, 240, 253, 381, 438/386–388, 396; 257/E21.345, E21.396
See application file for complete search history.

(56) References Cited

U.S. PATENT DOCUMENTS

| | | | | |
|---|---|---|---|---|
| 7,303,970 | B2 * | 12/2007 | Gutsche et al. | 438/381 |
| 7,442,604 | B2 * | 10/2008 | Choi et al. | 438/240 |
| 8,003,511 | B2 | 8/2011 | Rinerson et al. | |
| 8,633,084 | B1 * | 1/2014 | Ramaswamy et al. | 438/381 |
| 2006/0109708 | A1 | 5/2006 | Pinnow et al. | |
| 2011/0193043 | A1 | 8/2011 | Chin | |
| 2011/0278532 | A1 | 11/2011 | Rinerson et al. | |
| 2012/0211716 | A1 | 8/2012 | Meyer | |

* cited by examiner

*Primary Examiner* — Brook Kebede
(74) *Attorney, Agent, or Firm* — Wells St. John P.S.

(57) ABSTRACT

A method of forming a memory cell includes forming one of multivalent metal oxide material or oxygen-containing dielectric material over a first conductive structure. An outer surface of the multivalent metal oxide material or the oxygen-containing dielectric material is treated with an organic base. The other of the multivalent metal oxide material or oxygen-containing dielectric material is formed over the treated outer surface. A second conductive structure is formed over the other of the multivalent metal oxide material or oxygen-containing dielectric material.

31 Claims, 4 Drawing Sheets

METHODS OF FORMING A PROGRAMMABLE REGION THAT COMPRISES A MULTIVALENT METAL OXIDE PORTION AND AN OXYGEN CONTAINING DIELECTRIC PORTION

RELATED PARENT DATA

This patent resulted from a continuation of U.S. patent application Ser. No. 13/654,258, filed Oct. 17, 2012, entitled "Methods Of Forming A Memory Cell Having Programmable Material That Comprises A Multivalent Metal Oxide Portion And An Oxygen Containing Dielectric Portion" naming D. V. Nirmal Ramaswamy, Beth R. Cook, Lei Bi, Wayne Huang, and Ian C. Laboriante as inventors, the disclosure of which is incorporated by reference.

TECHNICAL FIELD

Embodiments disclosed herein pertain to methods of forming a memory cell having programmable material that comprises a multivalent metal oxide portion and an oxygen-containing dielectric portion.

BACKGROUND

Integrated circuits may be formed on a semiconductor substrate such as a silicon wafer or other semiconducting material. In general, various materials which are semiconducting, conducting, and/or insulating are used to form the integrated circuits. By way of examples, the various materials can be doped, ion implanted, deposited, etched, grown, etc. using various processes. A continuing goal in semiconductor processing is to continue to reduce the size of individual electronic components thereby enabling smaller and denser integrated circuitry.

Memory is one type of integrated circuitry, and is used in computer and other electronic systems for storing or managing data. One type of circuitry component is the transistor. Memory may be fabricated in one or more arrays of individual memory cells which may include a transistor. Memory cells may be written to or read from using data/sense lines, for example a digit or bit line, and access lines (which may also be referred to as word lines). The data/sense lines may electrically interconnect memory cells along columns of an array, and the access lines may electrically interconnect memory cells along rows of an array. Each memory cell may be uniquely addressed through the combination of a data/sense line and an access line.

Memory cells may be volatile, semi-volatile, or non-volatile. Non-volatile memory cells can store data for extended periods of time, in many instances including when the computer is turned off. Volatile memory dissipates and therefore requires being refreshed/rewritten, in many instances multiple times per second. Regardless, memory cells are configured to retain or store information/data in at least two different selectable states. In a binary system, the states are considered as either a "0" or a "1". In other systems, at least some individual memory cells may be configured to store more than two levels or states of information.

Integrated circuitry fabrication continues to strive to produce smaller and denser integrated circuits. Accordingly, there has been substantial interest in non-volatile memory cells that can be used in structures having programmable material between a pair of electrodes. Examples of such memory cells are resistive RAM (RRAM) cells, phase change RAM (PCRAM) cells, programmable metallization cells (PMCs) which may be alternatively referred to as a conductive bridging RAM (CBRAM) cells, nanobridge memory cells, or electrolyte memory cells. The memory cell types are not mutually exclusive. For example, RRAM may be considered to encompass PCRAM and PMCs.

One example programmable material of an RRAM cell comprises a multivalent metal oxide portion and an oxygen-containing dielectric portion. Such materials may be programmed by moving oxygen species (for instance, oxygen ions) within and between the different portions.

DETAILED DESCRIPTION OF EXAMPLE EMBODIMENTS

Methods of forming memory cells in accordance with example embodiments of the invention are described initially with reference to FIGS. 1-6. The individual memory cells comprise programmable material that is between a pair of electrodes, with the programmable material comprising a multivalent metal oxide portion and an oxygen-containing dielectric portion.

Figure 1:
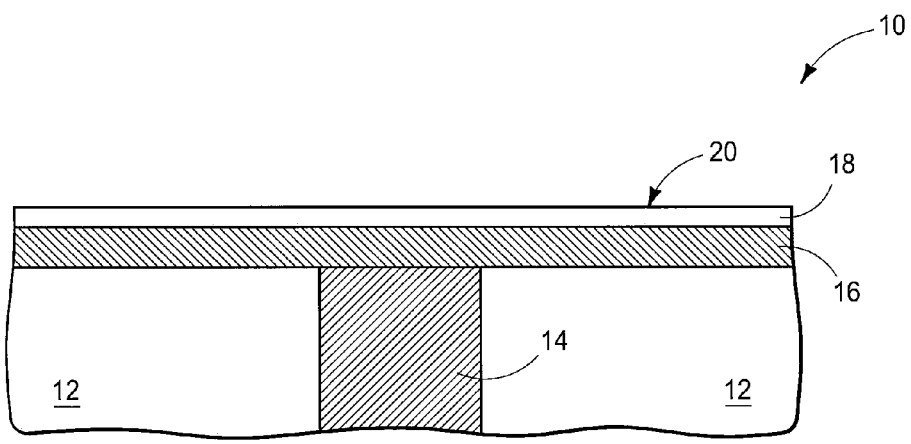
FIG. 1 is a diagrammatic sectional view of a substrate fragment in process in accordance with an embodiment of the invention.

Referring to FIG. 1, a substrate fragment 10, for example a semiconductor substrate, is shown. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Example substrate 10 comprises dielectric material 12 and electrically conductive material/structure 14 extending elevationally there-through. Each may be homogenous or non-homogenous, and other constructions may be used. Example dielectric material 12 includes one or more of doped or undoped silicon dioxide and silicon nitride.

Electrically conductive material/structure 16 is formed over and in conductive electrical connection with conductive material/structure 14. Material 16 alone or in combination with material 14 constitutes an example first conductive structure comprising an electrode of the memory cell being formed. Any alternate size and/or shape structure may be used. Conductive structure 14 may extend to or constitute part of suitable circuitry for accessing first conductive structure 16. Each of conductive structures 14 and 16 may comprise one or more of conductively-doped semiconductive material (e.g., conductively-doped silicon, conductively-doped germanium, etc.), elemental metals (e.g., platinum, tungsten, titanium, copper, aluminum, iridium, gold, etc.), alloys of two or more elemental metals, and metal compounds or other metal-containing compositions (e.g., metal silicides, metal nitrides, conductive metal nitrides, etc.).

Programmable material comprising a multivalent metal oxide portion and an oxygen-containing dielectric portion is ultimately formed over first conductive structure 16. For example, one of multivalent metal oxide material 18 or oxygen-containing dielectric material 18 has been formed over first conductive structure 16, and may be considered as having an outer surface 20. In one embodiment and as shown, material 18 is directly against first conductive structure 16. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another.

In some embodiments, the metal of a multivalent metal oxide material 18 comprises, consists essentially of, or consists of one or more of barium, cobalt, ruthenium, strontium, titanium, calcium, manganese, praseodymium, lanthanum, zirconium, indium, tin, magnesium, aluminum, cobalt, nickel, iron, copper, hafnium, tungsten, and samarium. Specific examples include one or a combination of $Sr_xRu_yO_z$, $Ru_xO_y$, $In_xSn_yO_z$, $MgO_x$, $Ta_2O_5$, $SrTiO_3$, $SrZrO_3$, $BaTiO_3$, $Ba_{(1-x)}Sr_xTiO_3$, $ZrO_x$ (perhaps doped with La), $MnO_x$ (perhaps doped with one or more of Ca, Pr, La, Sr, or Sm), $CoO_3$ (perhaps doped with one or more of Pr, La, Sr, or Sm), $(Pr,Ca)MnO_x$, $(La,Sr)CaO_x$, or materials in the form of $ABO_3$, $ABO_{3-d}$, $ABO_{3+d}$, $A_2BO_4$, $A_{0.6}BO_3$, $A_{1-x}BO_3$, $A_{0.3}BO_3$, and $A_nB_nO_{3n+1}$, where A and B are transition metal ions. In some embodiments, an oxygen-containing dielectric material 18 comprises, consists essentially of, or consists of one or more oxides of hafnium, titanium, zirconium, yttrium, and aluminum. In one embodiment, a multivalent metal oxide material comprises $La_xSr_yCoO_3$ in at least one operational state. In one embodiment, a multivalent metal oxide material consists essentially of lanthanum, strontium, cobalt, and oxygen in at least one operational state.

Figure 2:
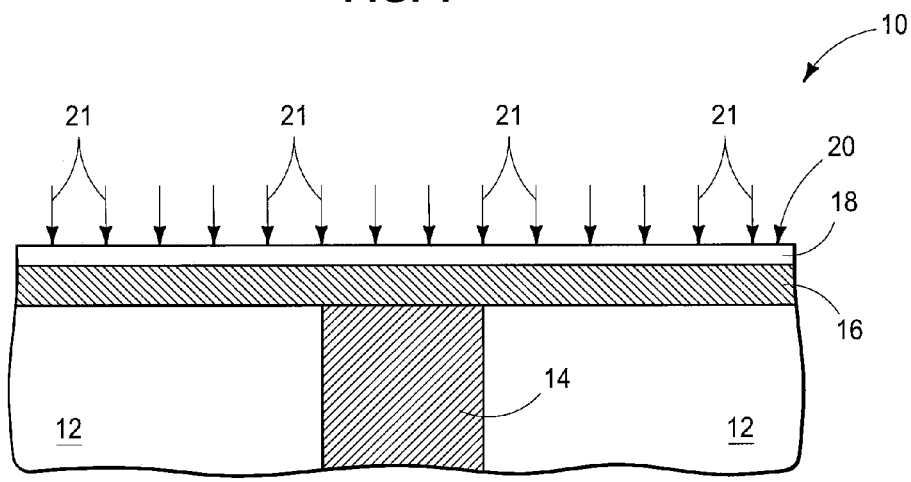
FIG. 2 is a view of the FIG. 1 substrate at a processing step subsequent to that shown in FIG. 1.

Referring to FIG. 2, outer surface 20 has been treated with an organic base, with the treatment diagrammatically being shown by downwardly-directed arrows 21. In one embodiment, outer surface 20 which is treated comprises multivalent metal oxide material, and in one embodiment comprises oxygen-containing dielectric material. In some embodiments, the treating may be with a liquid and/or gas containing the organic base. In some embodiments, the treating is at room ambient temperature and/or room ambient pressure. In one embodiment, the treating is for from about 5 seconds to about 2 minutes.

In one embodiment, the organic base is within a fluid having a pH from about 10 to 14. In one embodiment, the organic base is within a fluid at a concentration from about 0.0006 weight percent to about 5 weight percent, and in one embodiment from about 0.01 weight percent to about 0.1 weight percent of the fluid. In one embodiment, the organic base is within a fluid consisting of organic base and water. The treating may be with a single organic base, or with a combination of different composition organic bases.

In one embodiment, the organic base comprises an ammonium hydroxide, and in one embodiment a quarternary ammonium hydroxide. Some examples include quarternary ammonium hydroxide selected from the group consisting of tetramethylammonium hydroxide, tetraethylammonium hydroxide, tetrapropyl-ammonium hydroxide, tetrabutylammonium hydroxide, benzyltrimethylammonium hydroxide, dimethyldioctadecylammonium hydroxide, didecyldimethylammonium hydroxide, hexadecyltrimethylammonium hydroxide, cetyltrimethylammonium hydroxide, alkyldimethylbenzylammonium hydroxide, (dodecyldimethyl-2-phen-oxyethyl) ammonium hydroxide, benzethonium hydroxide, methyl-benzethonium hydroxide, cetalkonium hydroxide, and mixtures thereof. The ammonium hydroxide may be acyclic or cyclic (including heterocyclic).

In one embodiment, the organic base comprises phosphonium hydroxide, and in one embodiment an alkylphosphonium hydroxide (e.g., tetrabutylphosphonium hydroxide and/or hexadecyltributylphosphonium hydroxide). In one embodiment, the organic base is an amine, and in one embodiment an alkylamine (e.g., diethylamine and/or dimethylamine). In one embodiment, the organic base is heterocyclic. In one embodiment, the ring of a heterocyclic organic base comprises N (e.g., piperidine, pyridine, and imidazole), and in one embodiment the ring of a heterocyclic organic base comprises P (e.g., phosphines, phosphiranes, phosphoranes, mono-/di-phosphete, mono-/di-/tri-phosphabenzene).

In one embodiment, the multivalent metal oxide material or oxygen-containing dielectric material is polished prior to the treating, and in one embodiment where polished such is by chemical mechanical polishing (CMP).

Figure 3:
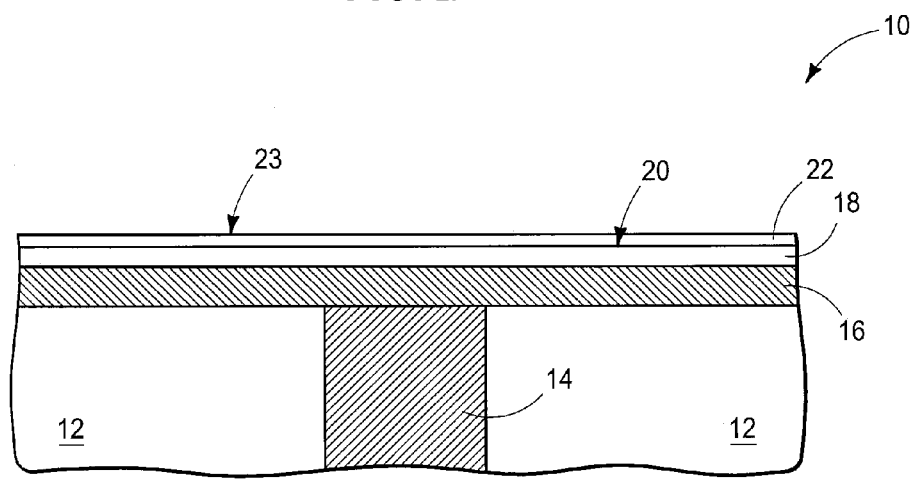
FIG. 3 is a view of the FIG. 2 substrate at a processing step subsequent to that shown in FIG. 2.

Referring to FIG. 3, the other of multivalent metal oxide material 22 or oxygen-containing dielectric material 22 has been formed over treated outer surface 20 of material 18, and in one embodiment directly against material 18.

Figure 4:
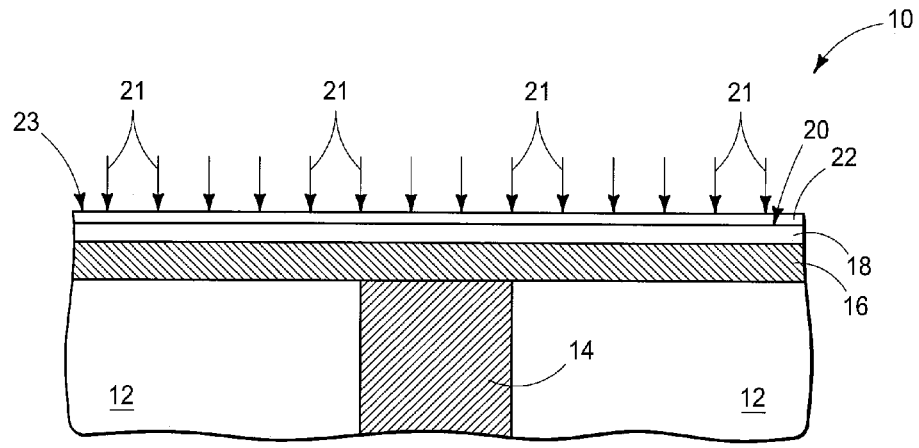
FIG. 4 is a view of the FIG. 3 substrate at a processing step subsequent to that shown in FIG. 3.

Referring to FIG. 4, an outer surface 23 of material 22 has optionally been treated with an organic base which may be of the same or different composition from that used in treating surface 20 of material 18. Material 22 may be polished, for example chemical mechanical polished, prior to the optional treatment of outer surface 23. Any other attribute associated with treatment of outer surface 23 may be the same as or different from those described above with respect to treatment of outer surface 20 of material 18.

Figure 5:
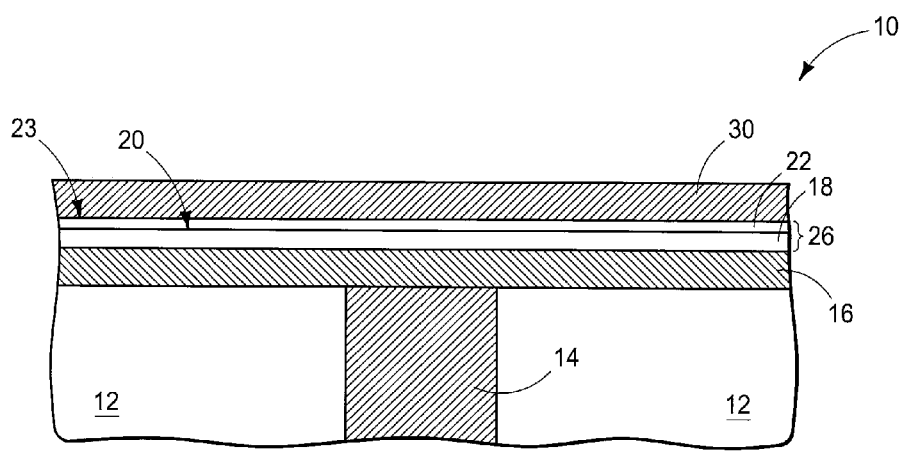
FIG. 5 is a view of the FIG. 4 substrate at a processing step subsequent to that shown in FIG. 4.

Referring to FIG. 5, a second conductive structure 30 has been formed over multivalent metal oxide material 22 or oxygen-containing dielectric material 22. Such may be of the same composition(s) or of different composition(s) as that of construction 16. Regardless, materials 18 and 22 constitute portions of programmable material 26 received between first conductive structure 16 and second conductive structure 30. Programmable material 26 may comprise additional oxides or other materials not comprising oxide. Any suitable thicknesses may be used with the depicted materials. By way of example only, material 22 is shown as being thinner than material 18, although this relationship could be reversed or materials 18 and 22 may be of the same thickness. Regardless, an example thickness for a multivalent metal oxide material portion is from about 10 Angstroms to about 2,000 Angstroms, and that for an oxygen-containing dielectric portion is from about 30 Angstroms to about 60 Angstroms.

Figure 6:
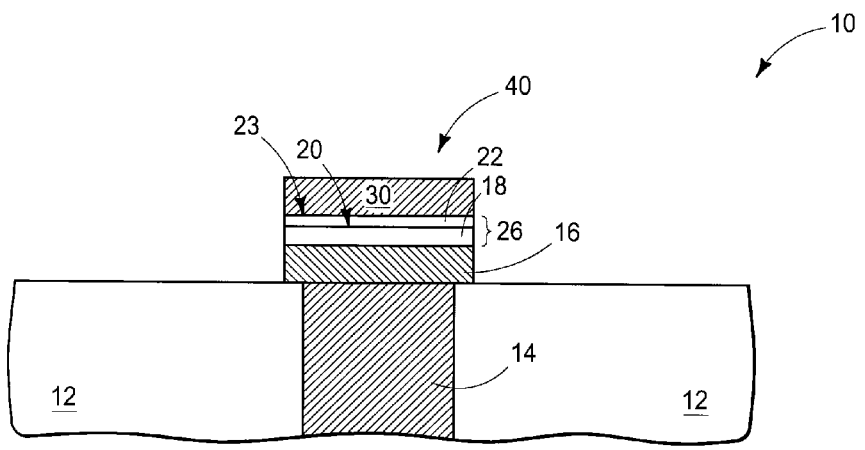
FIG. 6 is a view of the FIG. 5 substrate at a processing step subsequent to that shown in FIG. 5.

FIG. 6 shows example subsequent processing wherein structures 16, 26, and 30 have been subtractively patterned, thereby forming a memory cell 40. Alternate or additional processing in forming a memory cell may of course be used. For example, one or all of structures 16, 26 and 30 may be patterned using damascene-like processing.

Figure 7:
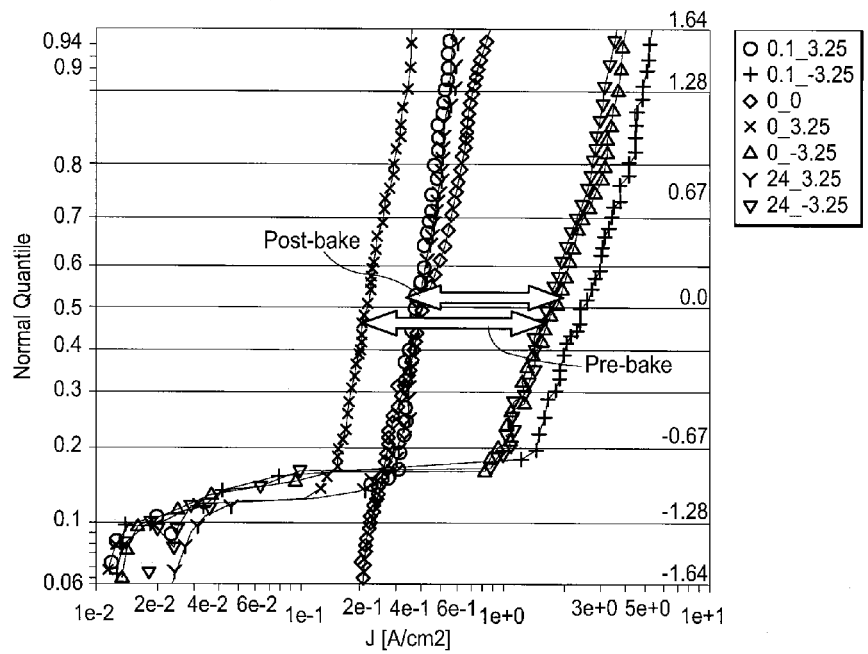
FIG. 7 shows reading current retention quantile plots of memory cells processed in accordance with an embodiment of the invention.

Methods of forming a memory cell in accordance with embodiments of the invention may improve memory effect in comparison to identical memory cells fabricated in accordance with prior art methods. FIG. 7 shows reading current retention quantile plots of memory cells fabricated in accordance with an embodiment of the invention. The forming of the memory cells included chemical mechanical polishing of a $La_xSr_yCoO_3$ multivalent metal oxide material 18 to produce outer surface 20. Such surface was then treated with a liquid comprising 0.063 weight percent tetramethylammonium hydroxide, with the rest being water. The treatment occurred at room ambient temperature and room ambient pressure for about 74 seconds. Each line plot was based upon analysis of fifty memory cells programmed by 3.25 volt, 10 microsecond, pulses between high resistance (positive V) and low resistance (negative V) states before and after baking at 55° C. for about 24 hours. The Pre-bake horizontal line shows difference between high and low resistance states, and thereby a memory effect, of the initially formed memory cells (i.e., prior to the 55° C., 24 hour bake). The Post-bake horizontal line shows the corresponding memory effect after the 55° C., 24 hour bake. In an ideal world, the depicted Pre-bake and Post-bake lines would be of the same length as one another, thereby being no change in memory effect. Nevertheless, FIG. 7 shows the Post-bake memory effect line to be very close in length to the Pre-bake memory effect line.

Figure 8:
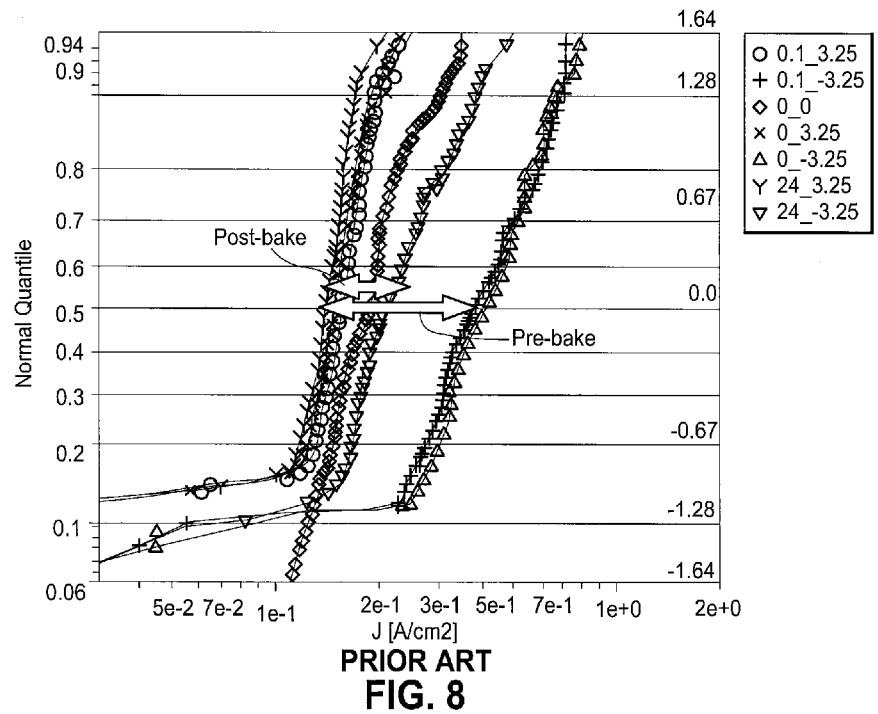
FIGS. 8 and 9 shows reading current retention quantile plots of memory cells processed in accordance with prior art methods.
Figure 9:
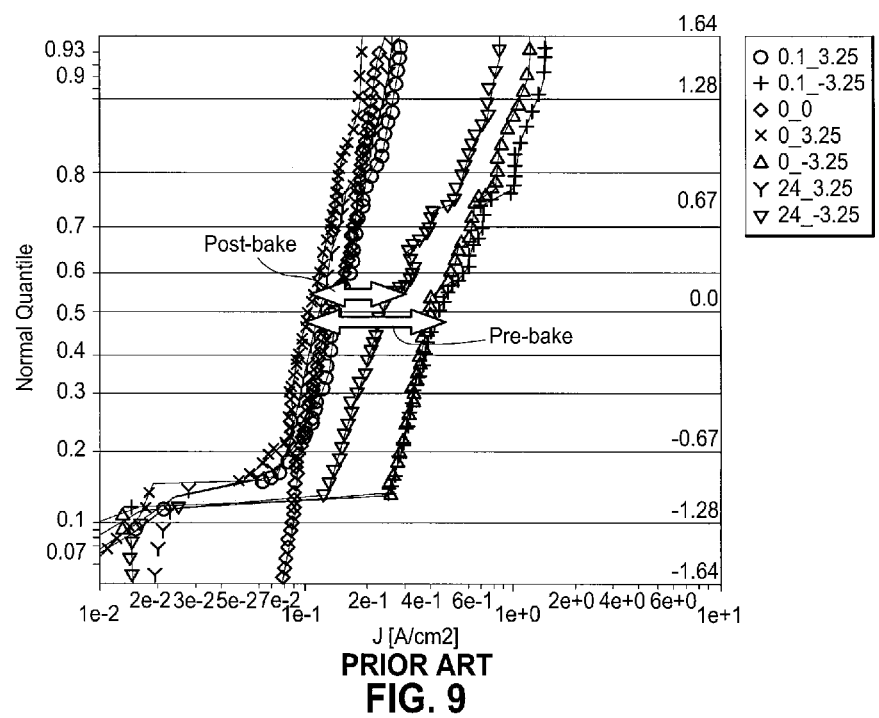

FIG. 8 shows the same line plots for fifty identically fabricated memory cells but where material 18 was neither chemical mechanical polished nor treated with any organic base. A comparison of FIG. 7 with that of FIG. 8 clearly shows the Post-bake memory effect line of FIG. 7 being considerably longer than the Post-bake line in FIG. 8, and correspondingly an improvement. FIG. 9 shows the same line plots for fifty identically fabricated memory cells as in FIG. 8 (i.e., without any organic base treatment of surface 20) but where chemical mechanical polish alone of material 18 was conducted (with a polishing solution not containing any organic base). Again, FIG. 7 shows an improvement in memory effect over that shown in FIG. 9.

Figure 10:
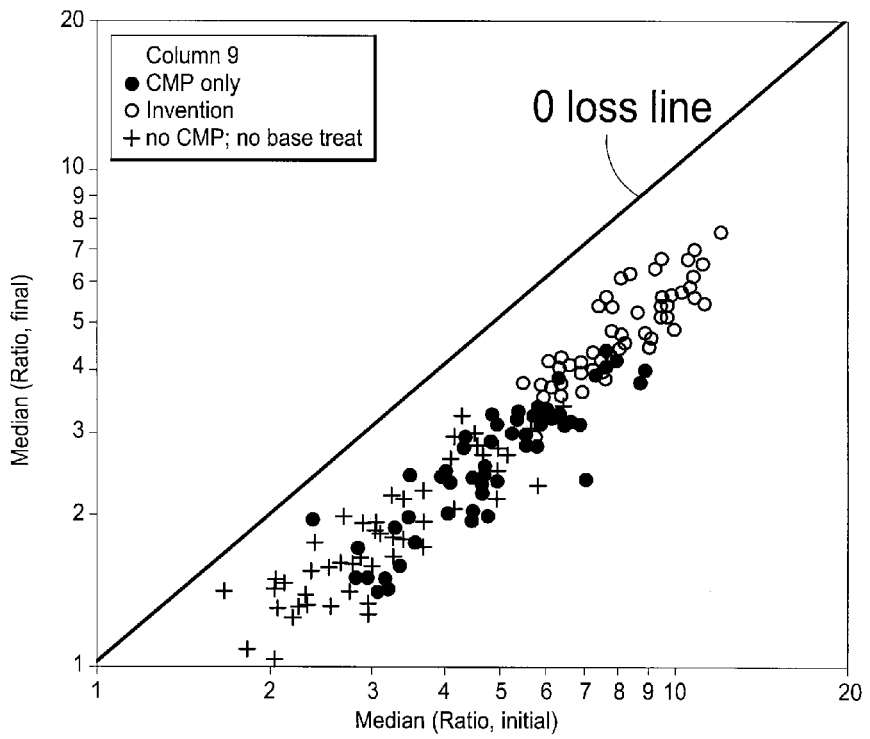
FIG. 10 is a plot of median ratio initial and median ratio final illustrating memory effect for memory cells processed in accordance with prior art methods and in accordance with an embodiment of the invention.

FIG. 10 uses data derived from FIGS. 7-9 and plots ratio of low resistance state to high resistance state of post-bake (the y-axis) as a function of pre-bake (the x-axis). Again in a perfect world there would be no loss and the data plots would fall essentially on the "0 loss line". That does not occur, and regardless FIG. 10 shows that the invention embodiment of FIG. 7 has significant less loss than the prior art of FIG. 9 (CMP without organic base treatment) and that of FIG. 8 (No CMP, no organic base treatment).

Where better data retention and/or better memory effect is achieved, such may be due to the organic base changing oxygen concentration and/or cation valence states at the outer surface of material 18, and which may induce better data retention in one or both of the low resistant state or high resistant state. Further, the organic base (and/or CMP when used) may remove an adverse film that may form atop material 18 prior to deposition of material 22.

CONCLUSION

In some embodiments, a method of forming a memory cell comprises forming one of multivalent metal oxide material or oxygen-containing dielectric material over a first conductive structure. An outer surface of the multivalent metal oxide material or the oxygen-containing dielectric material is treated with an organic base. The other of the multivalent metal oxide material or oxygen-containing dielectric material is formed over the treated outer surface. A second conductive structure is formed over the other of the multivalent metal oxide material or oxygen-containing dielectric material.

In some embodiments, a method of forming a memory cell comprises forming multivalent metal oxide material over a first conductive structure. The multivalent metal oxide material is chemical mechanical polished. An outer surface of the chemical mechanical polished multivalent metal oxide material is treated with an organic base. Oxygen-containing dielectric material is formed over the treated outer surface. A second conductive structure is formed over the oxygen-containing dielectric material.

In some embodiments, a method of forming a memory cell comprises forming multivalent metal oxide material over a first conductive structure. An outer surface of the multivalent metal oxide material is treated with an organic base. Oxygen-containing dielectric material is formed over the treated outer surface of the multivalent metal oxide material. An outer surface of the oxygen-containing dielectric material is treated with an organic base. A second conductive structure is formed over the treated outer surface of the oxygen-containing dielectric material.

In some embodiments, a method of forming a memory cell comprises forming oxygen-containing dielectric material over a first conductive structure. An outer surface of the oxygen-containing dielectric material is treated with an organic base. Multivalent metal oxide material is formed over the treated outer surface of the oxygen-containing dielectric material. An outer surface of the multivalent metal oxide material is treated with an organic base. A second conductive structure is formed over the treated outer surface of the multivalent metal oxide material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a programmable region of an electronic component of integrated circuitry, comprising:
   forming one of multivalent metal oxide material or oxygen-containing dielectric material over a substrate;
   treating an outer surface of the multivalent metal oxide material or the oxygen-containing dielectric material with an organic base; and
   forming the other of the multivalent metal oxide material or oxygen-containing dielectric material over the treated outer surface.

2. The method of claim 1 wherein the organic base is within a fluid having a pH from about 10 to 14.

3. The method of claim 1 wherein the organic base is within a fluid at a concentration from about 0.0006 weight percent to about 5 weight percent.

4. The method of claim 1 wherein the treating is with a liquid containing the organic base.

5. The method of claim 1 wherein the treating is with a gas containing the organic base.

6. The method of claim 1 wherein the organic base is within a fluid consisting essentially of organic base and water.

7. The method of claim 1 wherein the treating is with a combination of different composition organic bases.

8. The method of claim 1 wherein the organic base comprises an ammonium hydroxide.

9. The method of claim 8 wherein the ammonium hydroxide comprises a quarternary ammonium hydroxide.

10. The method of claim 9 wherein the quarternary ammonium hydroxide is selected from the group consisting of tetramethylammonium hydroxide, tetraethylammonium hydroxide, tetrapropylammonium hydroxide, tetrabutyl-ammonium hydroxide, benzyltrimethylammonium hydroxide, dimethyldioctadecyl-ammonium hydroxide, didecyldimethylammonium hydroxide, hexadecyltrimethyl-ammonium hydroxide, cetyltrimethylammonium hydroxide, alkyldimethylbenzyl-ammonium hydroxide, (dodecyldimethyl-2-henoxyethyl)ammonium hydroxide, benzethonium hydroxide, methylbenzethonium hydroxide, cetalkonium hydroxide, and mixtures thereof.

11. The method of claim 8 wherein the ammonium hydroxide is heterocyclic.

12. The method of claim 1 wherein the organic base is cyclic.

13. The method of claim 12 wherein the organic base is heterocyclic.

14. The method of claim 13 wherein the ring of the heterocyclic organic base comprises N.

15. The method of claim 13 wherein the ring of the heterocyclic organic base comprises P.

16. The method of claim 1 wherein the organic base is acyclic.

17. The method of claim 1 wherein the organic base is an amine.

18. The method of claim 17 wherein the amine is an alkyl amine.

19. The method of claim 1 wherein the organic base comprises a phosphonium hydroxide.

20. The method of claim 19 wherein the phosphonium hydroxide comprises an alkylphosphonium hydroxide.

21. The method of claim 1 comprising polishing the multivalent metal oxide material or oxygen-containing dielectric material prior to the treating.

22. The method of claim 1 wherein the outer surface that is treated comprises multivalent metal oxide material.

23. The method of claim 22 wherein the organic base comprises tetramethyl ammonium hydroxide.

24. The method of claim 22 wherein the multivalent metal oxide comprises $La_xSr_yCoO_3$.

25. The method of claim 24 wherein the organic base comprises tetramethyl ammonium hydroxide.

26. The method of claim 1 wherein the outer surface that is treated comprises oxygen-containing dielectric material.

27. A method of forming a programmable region of an electronic component of integrated circuitry, comprising:
   forming multivalent metal oxide material over a substrate;
   chemical mechanical polishing the multivalent metal oxide material;
   treating an outer surface of the chemical mechanical polished multivalent metal oxide material with an organic base; and
   forming oxygen-containing dielectric material over the treated outer surface.

28. A method of forming a programmable region of an electronic component of integrated circuitry, comprising:
   forming multivalent metal oxide material over a substrate;
   treating an outer surface of the multivalent metal oxide material with an organic base;
   forming oxygen-containing dielectric material over the treated outer surface of the multivalent metal oxide material; and
   treating an outer surface of the oxygen-containing dielectric material with an organic base.

29. The method of claim 28 wherein the organic base used in treating the outer surface of the multivalent metal oxide material and the organic base used in treating the outer surface of the oxygen-containing dielectric material are different composition organic bases.

30. The method of claim 28 wherein the organic base used in treating the outer surface of the multivalent metal oxide material and the organic base used in treating the outer surface of the oxygen-containing dielectric material are of the same composition.

31. A method of forming a programmable region of an electronic component of integrated circuitry, comprising:
   forming oxygen-containing dielectric material over a substrate;
   treating an outer surface of the oxygen-containing dielectric material with an organic base;
   forming multivalent metal oxide material over the treated outer surface of the oxygen-containing dielectric material; and
   treating an outer surface of the multivalent metal oxide material with an organic base.

* * * * *

UNITED STATES PATENT AND TRADEMARK OFFICE
CERTIFICATE OF CORRECTION

PATENT NO. : 8,809,157 B2  
APPLICATION NO. : 14/105623  
DATED : August 19, 2014  
INVENTOR(S) : Ramaswamy et al.

Page 1 of 1

It is certified that error appears in the above-identified patent and that said Letters Patent is hereby corrected as shown below:

In the Claims  
Column 7, line 6, Claim 9, delete "quarternary" and insert -- quaternary --, therefor.  
Column 7, line 7, Claim 10, delete "quarternary" and insert -- quaternary --, therefor.  
Column 7, line 16, Claim 10, delete "henoxyethyl)" and insert -- phenoxyethyl) --, therefor.

Signed and Sealed this  
Twenty-eighth Day of October, 2014

Michelle K. Lee  
*Deputy Director of the United States Patent and Trademark Office*